United States Patent
Ogasawara

(10) Patent No.: US 10,451,976 B2
(45) Date of Patent: Oct. 22, 2019

(54) ELECTRON BEAM IRRADIATION APPARATUS AND ELECTRON BEAM DYNAMIC FOCUS ADJUSTMENT METHOD

(71) Applicant: NuFlare Technology, Inc., Yokohama-shi (JP)

(72) Inventor: Munehiro Ogasawara, Hiratsuka (JP)

(73) Assignee: NuFlare Technology, Inc., Yokohama-shi (JP)

(\*) Notice: Subject to any disclaimer, the term of this patent is extended or adjusted under 35 U.S.C. 154(b) by 66 days.

(21) Appl. No.: 15/895,285

(22) Filed: Feb. 13, 2018

(65) Prior Publication Data
US 2018/0284620 A1 Oct. 4, 2018

(30) Foreign Application Priority Data

Mar. 30, 2017 (JP) ................. 2017-067617

(51) Int. Cl.
*H01J 37/145* (2006.01)
*H01J 37/12* (2006.01)
*G03F 7/20* (2006.01)
*G03F 1/78* (2012.01)
*H01L 21/027* (2006.01)

(52) U.S. Cl.
CPC ............ *G03F 7/70383* (2013.01); *G03F 1/78* (2013.01); *G03F 7/2063* (2013.01); *H01J 37/12* (2013.01); *H01L 21/0277* (2013.01); *H01J 2237/20228* (2013.01)

(58) Field of Classification Search
CPC ...... G03F 1/78; G03F 7/2059; G03F 1/70383; H01J 37/10; H01J 37/12; H01J 37/145; H01J 37/3174
See application file for complete search history.

(56) References Cited

U.S. PATENT DOCUMENTS

| | | | |
|---|---|---|---|
| 4,546,258 A | * 10/1985 | Chisholm | ........... H01J 37/3007 250/396 ML |
| 8,816,276 B2 | 8/2014 | Touya et al. | |
| 8,884,254 B2 | 11/2014 | Touya et al. | |
| 9,343,266 B2 | 5/2016 | Ogasawara et al. | |
| 9,373,424 B2 | 6/2016 | Touya et al. | |
| 2014/0175303 A1* | 6/2014 | Touya | ................ H01J 37/3026 250/398 |

FOREIGN PATENT DOCUMENTS

| | | |
|---|---|---|
| JP | 2013-168589 | 8/2013 |
| JP | 2013-191841 | 9/2013 |
| JP | 2014-49545 | 3/2014 |
| JP | 2014-127568 | 7/2014 |

\* cited by examiner

*Primary Examiner* — Eliza W Osenbaugh-Stewart
(74) *Attorney, Agent, or Firm* — Oblon, McClelland, Maier & Neustadt, L.L.P.

(57) ABSTRACT

An electron beam irradiation apparatus includes a first electrode being annular, arranged along the optical axis of the electron beam, at the downstream from the deflector, and in the magnetic field of the objective lens, to which a first potential being positive is variably applied, a second electrode being annular, arranged in the magnetic field of the objective lens and between the deflector and the first electrode, to which a second potential being positive and higher than the first potential is applied, and a third electrode being annular, arranged in the magnetic field of the objective lens and to be opposite to the second electrode with respect to the first electrode, to which a third potential lower than the first potential is applied.

10 Claims, 11 Drawing Sheets

ELECTRON BEAM IRRADIATION APPARATUS AND ELECTRON BEAM DYNAMIC FOCUS ADJUSTMENT METHOD

CROSS-REFERENCE TO RELATED APPLICATION

This application is based upon and claims the benefit of priority from the prior Japanese Patent Application No. 2017-067617 filed on Mar. 30, 2017 in Japan, the entire contents of which are incorporated herein by reference.

BACKGROUND OF THE INVENTION

Field of the Invention

Embodiments of the present invention relate to an electron beam irradiation apparatus and an electron beam dynamic focus adjustment method, and, for example, relate to a dynamic focus adjustment method in the electron beam writing apparatus.

Description of Related Art

In recent years, with high integration of LSI, the line width (critical dimension) of semiconductor device circuits is decreasing year by year. An electron beam (EB) writing technique which has excellent resolution is used as a method of producing an exposure mask (also referred to as a reticle) for forming a circuit pattern on such semiconductor devices.

FIG. 11 is a conceptual diagram explaining operations of a variable-shaped electron beam writing or "drawing" apparatus. The variable-shaped electron beam writing apparatus operates as described below. A first aperture plate 410 has a quadrangular (rectangular) aperture 411 for shaping an electron beam 330. A second aperture plate 420 has a variable shape aperture 421 for shaping the electron beam 330 having passed through the aperture 411 of the first aperture plate 410 into a desired quadrangular shape. The electron beam 330 emitted from a charged particle source 430 and having passed through the aperture 411 of the first aperture plate 410 is deflected by a deflector so as to pass through a part of the variable shape aperture 421 of the second aperture plate 420, and thereby to irradiate a target object or "sample" 340 placed on a stage which continuously moves in one predetermined direction (e.g., x direction). In other words, a quadrangular shape that can pass through both the aperture 411 of the first aperture plate 410 and the variable shape aperture 421 of the second aperture plate 420 is used for pattern writing in a writing region of the target object 340 on the stage continuously moving in the x direction. This method of forming a given shape by letting beams pass through both the aperture 411 of the first aperture plate 410 and the variable shape aperture 421 of the second aperture plate 420 is referred to as a variable shaped beam (VSB) system.

In the electron beam writing apparatus, there is performed a dynamic focus adjustment that dynamically adjusts a focus position focused by an objective lens, depending on unevenness (concave and convex) of the surface of the target object. This dynamic focus adjustment is carried out using a lens having a high responsivity, such as an electrostatic lens. As the electrostatic lens, an annular three-stage electrode is used, wherein a ground potential is applied to the upper and lower electrodes and a positive potential, for example, to be applied to the second-stage electrode is variably adjusted, thereby performing a dynamic focus adjustment (e.g., refer to Japanese Patent Application Laid-open (JP-A) No. 2013-191841).

BRIEF SUMMARY OF THE INVENTION

According to one aspect of the present invention, an electron beam irradiation apparatus includes an emission source configured to emit an electron beam, a deflector configured to deflect the electron beam to a desired position on a surface of a target object, an objective lens configured to focus the electron beam to form an image on the surface of the target object, a first electrode being annular, arranged along an optical axis of the electron beam, at a position downstream from the deflector, and in a magnetic field of the objective lens, in which a first aperture is formed in a central portion such that the electron beam passes through it, and to which a first potential being positive is variably applied, a second electrode being annular, arranged in the magnetic field of the objective lens and between the deflector and the first electrode, in which a second aperture is formed in a central portion such that the electron beam passes through it, and to which a second potential being positive and higher than the first potential is applied, and a third electrode being annular, arranged in the magnetic field of the objective lens and at a position opposite to the second electrode with respect to the first electrode, in which a third aperture is formed in a central portion such that the electron beam passes through it, and to which a third potential lower than the first potential is applied.

According to another aspect of the present invention, an electron beam dynamic focus adjustment method includes adjusting a focus of an electron beam dynamically depending on unevenness of a surface of a target object in a state where the electron beam has been focused on the surface of the target object by an objective lens, using an annular multi-stage electrode composed of a first-stage electrode, a second-stage electrode, and a third-stage electrode, by variably changing a first potential being positive applied to the second-stage electrode, and making a second potential applied to the first-stage electrode and a third potential applied to the third-stage electrode fixed, and making the second potential applied to the first-stage electrode be a positive potential higher than the first potential, and removing an electron of a low energy component which floats at a side of an optical axis of the second-stage electrode to a side of the first-stage electrode.

DETAILED DESCRIPTION OF THE INVENTION

A dynamic focus adjustment method of applying a positive potential to the second-stage electrode of an electrostatic lens is examined because it can make a reflected electron, etc. reflected from the target object surface not return to the target object surface. However, along with an increase in the strength of the magnetic field by an objective lens, electrons are enclosed within the space in the central portion of the electrostatic lens and a negative space potential is generated, thereby causing a problem that the trajectory of an electron beam is affected. This problem is not limited to the writing apparatus, and therefore, a similar problem may occur in an apparatus irradiating electron beams.

The embodiments below describe an apparatus and method that can perform dynamic focus adjustment while preventing a negative space potential which affects the trajectory of an electron beam from being generated.

Moreover, the Embodiments below describe an electron beam writing apparatus as an example of the electron beam irradiation apparatus. The electron beam irradiation apparatus is not limited to a writing apparatus, and, for example, may be an apparatus which irradiates an electron beam, such as an inspection apparatus etc. Moreover, the Embodiments below describe a configuration where irradiation of a single beam composed of one electron beam is performed. However, the electron beam is not limited to a single beam, and may be multi-beams composed of a plurality of electron beams. Furthermore, a variable-shaped beam type writing apparatus will be described as an example of the electron beam writing apparatus.

First Embodiment

Figure 1:
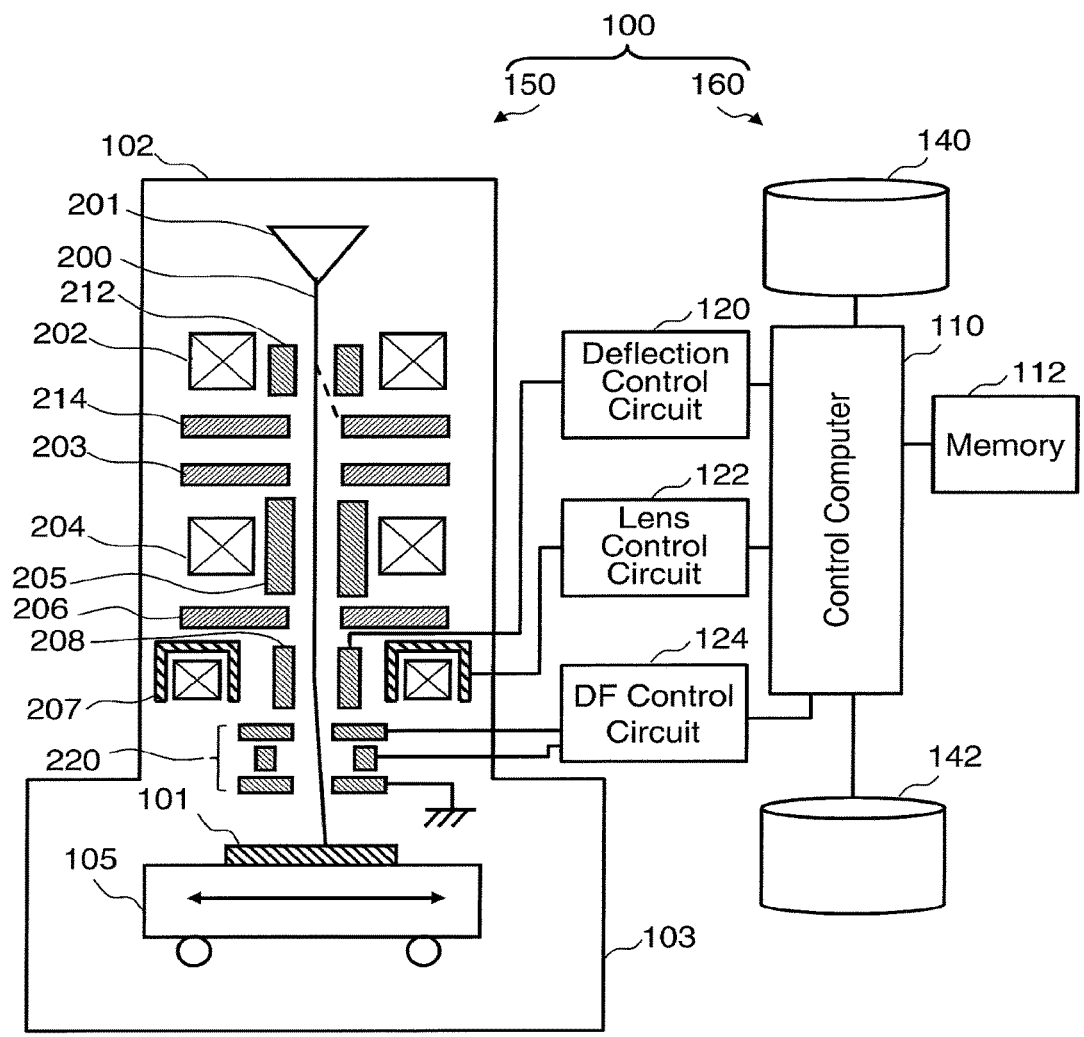
FIG. 1 is a schematic diagram showing a configuration of a writing apparatus according to a first embodiment.

FIG. 1 is a schematic diagram showing a configuration of a writing or "drawing" apparatus according to a first embodiment. In FIG. 1, a writing apparatus 100 includes a writing mechanism 150 and a control system circuit 160. The writing apparatus 100 is an example of an electron beam writing apparatus, and particularly, an example of a variable shaped beam (VSB) writing apparatus. The writing mechanism 150 includes an electron optical column 102 and a writing chamber 103. In the electron optical column 102, there are arranged an electron gun 201, an illumination lens 202, a blanking deflector (blanker) 212, a blanking aperture substrate 214, a first shaping aperture substrate 203, a projection lens 204, a deflector 205, a second shaping aperture substrate 206, an objective lens 207, a deflector 208, and an electrostatic lens 220. In the writing chamber 103, there is arranged an XY stage 105 that is movable at least in the x-y direction. On the XY stage 105, there is placed a target object 101 (substrate) serving as a writing target on which resist has been applied. The target object 101 is an exposure mask, a silicon wafer, and the like used for manufacturing semiconductor devices. The mask may be, for example, a mask blank.

The control system circuit 160 includes a control computer 110, a memory 112, a deflection control circuit 120, a lens control circuit 122, a dynamic focus control circuit 124, and storage devices 140 and 142, such as magnetic disk drives. The control computer 110, the memory 112, the deflection control circuit 120, the lens control circuit 122, the dynamic focus control circuit 124, and the storage devices 140 and 142 are connected with each other through a bus (not shown). The deflector 208 is connected to and controlled by the deflection control circuit 120. Moreover, although not shown, the blanking deflector 212 and the deflector 205 are connected to and controlled by the deflection control circuit 120. The objective lens 207 is connected to and controlled by the lens control circuit 122. Although not shown, the illumination lens 202 and the projection lens 204 are connected to and controlled by the lens control circuit 122. The electrostatic lens 220 is connected to and controlled by the dynamic focus control circuit 124.

Input data necessary for the control computer 110, and operated (calculated) results are stored in the memory 112 each time.

Chip data that defines data of a chip pattern is input from the outside of the writing apparatus 100, and stored in the storage device 140.

FIG. 1 shows configuration elements necessary for describing the first embodiment. It should be understood that other configuration elements generally necessary for the writing apparatus 100 may also be included therein.

Figure 2:
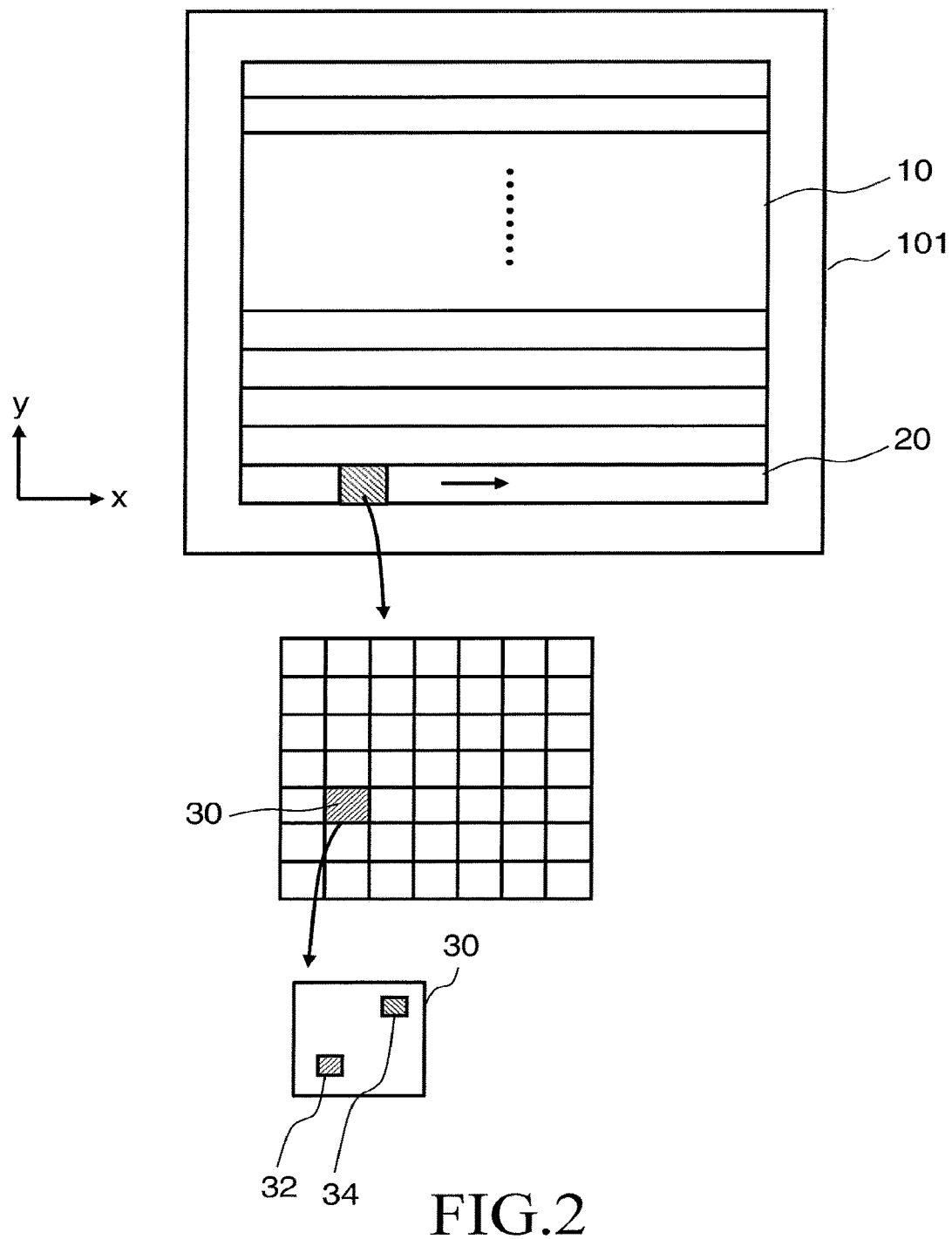
FIG. 2 is a conceptual diagram for explaining each region according to the first embodiment.

FIG. 2 is a conceptual diagram for explaining each region according to the first embodiment. In FIG. 2, a writing region 10 of the target object 101 is virtually divided by the width deflectable by the deflector 208 into a plurality of strip-shaped stripe regions 20 which are arrayed, for example, along the y direction. Further, each stripe region 20 is virtually divided into a plurality of mesh-like sub-fields (SF) 30 (sub-deflection region). Then, shot FIGS. 32 and 34 are written at respective shot positions in each SF 30.

When performing writing processing, the control computer 110 starts the writing processing by controlling the deflection control circuit 120, the lens control circuit 122, the dynamic focus control circuit 124, the writing mechanism 150, etc.

In the control computer 110, chip data (writing data) stored in the storage device 140 is read out, and each of a plurality of figure patterns in the chip data is divided into a plurality of shot figures each having the size to be formed by the writing apparatus 100. Then, shot data is generated for each shot figure. The shot data defines the figure type, coordinates of figure shot position, shot size, and the like. Generated shot data is stored in the storage device 142. The writing mechanism 150 writes a pattern at each shot position by using an electron beam 200, under the control of the deflection control circuit 120, the lens control circuit 122, and the dynamic focus control circuit 124. Specifically, it operates as follows:

With respect to the electron beam 200 emitted from the electron gun 201 (emission source), when passing through the blanking deflector 212, the beam is controlled by the blanking deflector 212 to pass through the blanking aperture substrate 214 when in a beam ON condition, and the whole of the beam is deflected to be blocked by the blanking aperture substrate 214 when in a beam OFF condition. The electron beam 200 that has passed through the blanking aperture substrate 214 during the period from changing a beam OFF condition to a beam ON condition to changing the beam ON condition to a beam OFF condition serves as one shot of the electron beam. The blanking deflector 212 controls the direction of the passing electron beam 200 to alternately generate a beam ON condition and a beam OFF condition. For example, when in a beam ON condition, no voltage is applied to the blanking deflector 212, and, when in a beam OFF condition, a voltage should be applied to it. The dose per shot of the electron beam 200 to irradiate the target object 101 is adjusted depending upon the irradiation time of each shot.

As described above, each shot of the electron beam 200 generated by passing through the blanking deflector 212 and the blanking aperture substrate 214 irradiates the whole of the first shaping aperture substrate 203 having a quadrangular (rectangular) opening by the illumination lens 202. At this stage, the electron beam 200 is first shaped to a quadrangle. Then, after passing through the first shaping aperture substrate 203, the electron beam 200 of the first aperture image is projected onto the second shaping aperture substrate 206 by the projection lens 204. The first aperture image on the second shaping aperture substrate 206 is deflection-controlled by the deflector 205 so as to change (variably shape) the shape and size of the beam. Such variable shaping is performed for each shot, and each shot is generally shaped to have a different shape and size. Then, after passing through the second shaping aperture substrate 206, the electron beam 200 of the second aperture image is focused by the objective lens 207. In other words, the electron beam 200 of the second aperture image is focused to form an image on the surface of the target object 101 by the objective lens 207. The focus adjustment is dynamically performed along the uneven (concave and convex) surface of the irradiation position by the electrostatic lens 220. The electron beam 200 of the second aperture image is deflected by the deflector 208 to reach a desired position on the target object 101. In other words, the electron beam 200 of the second aperture image is made by the deflector 208 to irradiate a desired position on the target object 101 placed on the XY stage 105 which moves continuously. Thus, a plurality of shots of the electron beam 200 are deflected in order, by the deflector, onto the target object 101 serving as a substrate.

With respect to unevenness of the surface of the target object 101, it may be measured in such a manner that an unevenness distribution on the target object surface is measured in advance by a Z sensor, etc. (not shown). Alternatively, it is also preferable that while measuring in real time the height of unevenness on the target object surface by a Z sensor, etc. (not shown), the focus position is dynamically adjusted depending on the unevenness. Such measured data is output to the dynamic focus control circuit 124, and then, a focus position is corrected in accordance with the data.

Figures 3A, 3B:
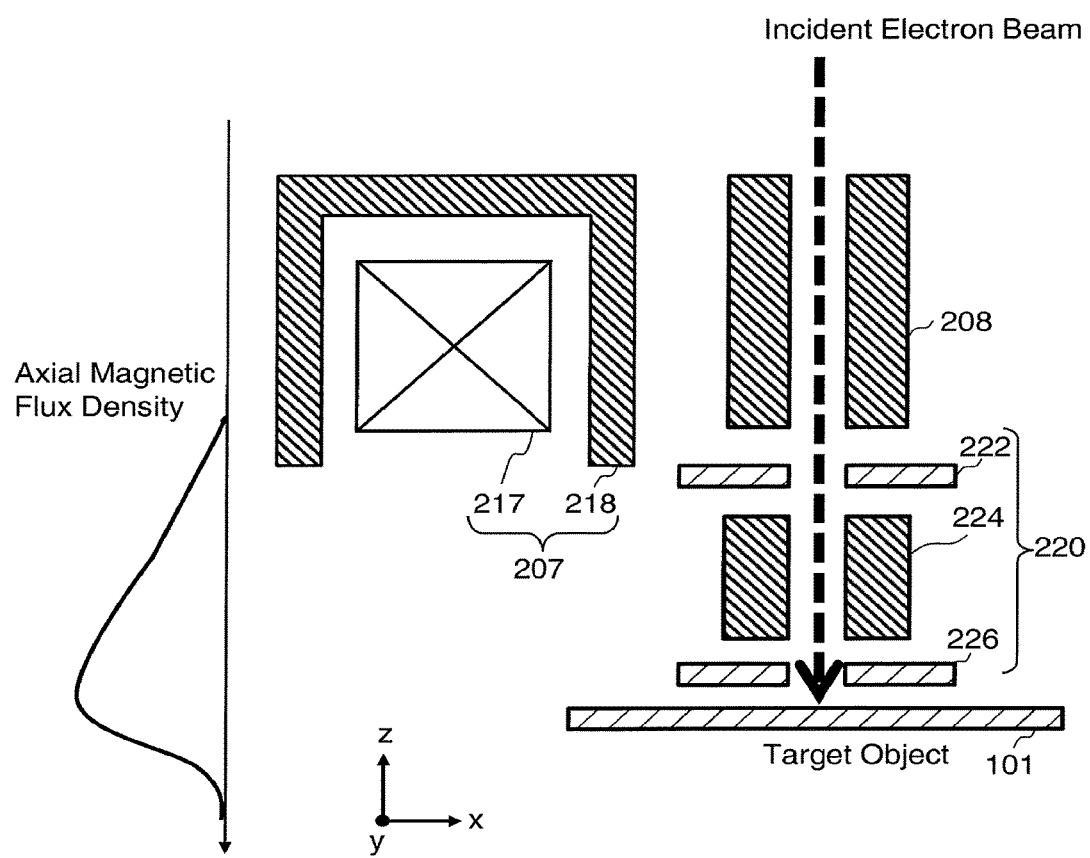
FIGS. 3A and 3B show an example of an arrangement structure around an objective lens and a magnetic field according to the first embodiment.

FIGS. 3A and 3B show an example of an arrangement structure around the objective lens and a magnetic field according to the first embodiment. On account of the size of the sheet, FIG. 3B shows only one side, for example the left side, of the section of the objective lens, with respect to the optical axis (or "center axis of a trajectory of the electron beam"). In FIG. 3B, the objective lens 207 includes a pole piece 218 and a coil 217, where the pole piece 218 is arranged such that its aperture opens at the downstream side of the optical axis of an electron beam, and the coil 217 is arranged at inner part of the pole piece 218. In the case where the aperture of the pole piece 218 is at the downstream side of the optical axis, as shown in FIG. 3A, the axial (on-axis) magnetic field generated when the objective lens 207 is excited gradually increases toward the downstream side from the upstream side at a little upper than the aperture of the pole piece 218, becomes the maximum value at the position close to the surface of the target object 101, and then decreases gradually. The electrostatic lens 220 is arranged in the magnetic field of the objective lens 207.

In FIG. 3B, the electrostatic lens 220 is configured by an annular multi-stage (here, three-stage) electrode composed of a first-stage electrode 222, a second-stage electrode 224, and a third-stage electrode 226, for example. As shown in FIGS. 3A and 3B, the second-stage electrode 224 (first electrode) is arranged along the optical axis (or "center axis of a trajectory") of the electron beam, at the position downstream from the deflector 208, and in the magnetic field of the objective lens 207. In the central portion of the second-stage electrode 224, an aperture (first aperture) through which the electron beam 200 passes is formed. The second-stage electrode 224 serves as a control electrode for dynamic focusing. Moreover, as shown in FIGS. 3A and 3B, the first-stage electrode 222 (second electrode) is arranged in the magnetic field of the objective lens 207, and between the deflector 208 and the electrode 224. In the central portion of the first-stage electrode 222, an aperture (second aperture) through which the electron beam 200 passes is formed. The first-stage electrode 222 (second electrode) is arranged at a position in the magnetic field of the objective lens 207 where the magnetic flux density on the central axis of the magnetic field is lower than that of the second-stage electrode 224 (first electrode). The first-stage electrode 222 also serves as a limiting aperture substrate between the deflector 208 and the second-stage electrode 224. The third-stage electrode 226 (third electrode) is arranged in the magnetic field of the objective lens 207, and at the position opposite to the electrode 222 with respect to the electrode 224. In the central portion of the third-stage electrode 226, an aperture (third aperture) through which the electron beam 200 passes is formed. Moreover, the third-stage electrode 226 also serves as an objective aperture substrate between the second-stage electrode 224 and the target object 101. As shown in FIG. 3B, the thickness in the z direction of the first-stage electrode 222 and the third-stage electrode 226 may be thinner than that of the second-stage electrode 224, or may be around the same as that of the second-stage electrode 224. Alternately, serving functionally as an electrostatic lens, the thickness in the z direction of the first-stage electrode 222 and the third-stage electrode 226 may be thicker than that of the second-stage electrode 224.

Figure 4:
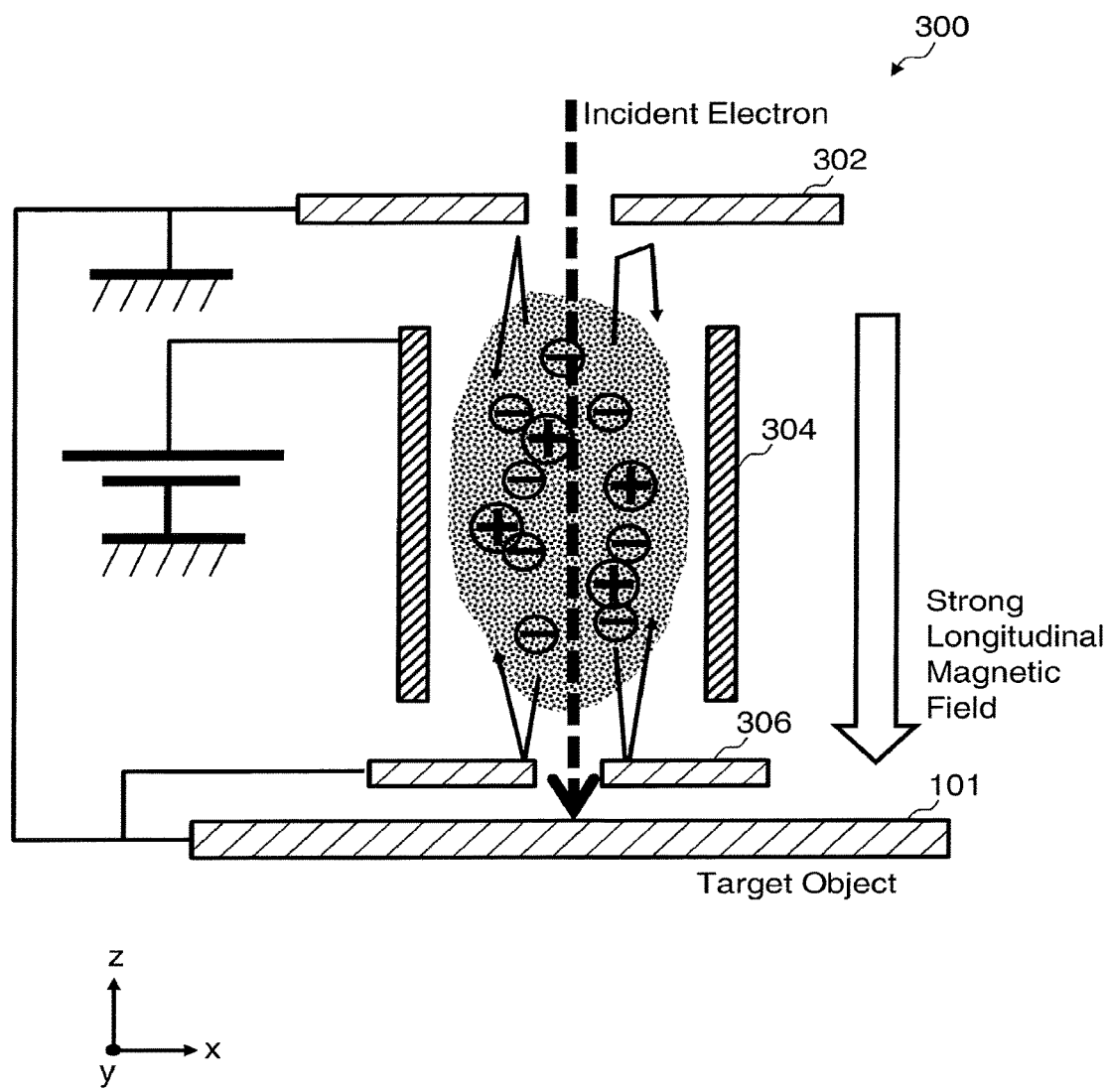
FIG. 4 shows an example of the state in the magnetic field of an objective lens according to a comparative example of the first embodiment.
Figure 5:
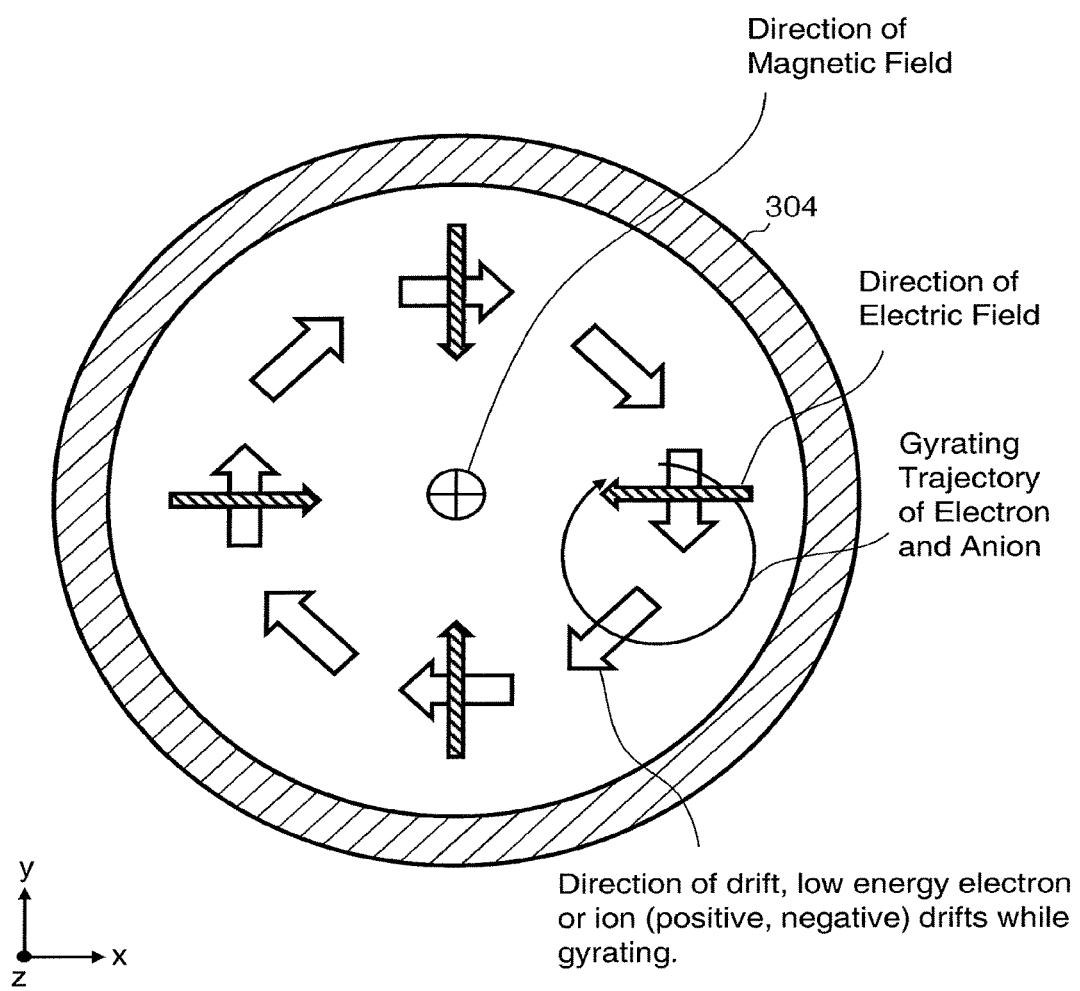
FIG. 5 is a top view showing an example of the state in the magnetic field of an objective lens according to a comparative example of the first embodiment.

FIG. 4 shows an example of the state in the magnetic field of an objective lens according to a comparative example of the first embodiment. In the comparative example of the first embodiment, an electrostatic lens 300 is arranged in the magnetic field of the objective lens (not shown), where the electrostatic lens 300 is composed of a first-stage electrode 302, a second-stage electrode 304, and a third-stage electrode 306. In the comparative example of the first embodiment, focus adjustment is performed by variably applying a positive potential to the second-stage electrode 304 in the state where a ground potential has been applied to the surface of the target object 101, the first-stage electrode 302, and the third-stage electrode 306. In FIG. 4, the incident electron having passed through the aperture of the first-stage electrode 302 collides with the third-stage electrode 306 or the surface of the target object, thereby generating low energy secondary electrons. Moreover, a neutral gas existing in the central part of the electrostatic lens is ionized, thereby also generating low energy electrons or ions (positive, negative). Furthermore, the neutral gas existing in the central part of the electrostatic lens is also ionized by the secondary electrons, etc. generated due to the collision with the target object surface, thereby also generating low energy electrons or ions (positive, negative). By applying a positive potential to the second-stage electrode 304, it becomes possible to avoid that the secondary electrons, etc. generated due to the collision with the target object surface return thereto. However, the following problems arise:

FIG. 5 is a top view showing an example of the state in the magnetic field of an objective lens according to a comparative example of the first embodiment. FIG. 5 shows the second-stage electrode 304 at the intermediate height position seen from the upper part. In FIG. 5, the direction of the magnetic field due to the objective lens is in the downstream direction (−z direction) along the optical axis. In this state, the movement in the x-y direction (lateral direction) of the above-described electrons including low energy secondary electrons or low energy ions (positive, negative) is restricted by the magnetic field due to the objective lens. Moreover, the movement in the z direction (height direction) of these low energy secondary electrons or ions is restricted by an electric potential difference. Therefore, as shown in FIG. 5, the low energy secondary electrons or ions drift while gyrating in the central space of the second-stage electrode 304.

For example, the velocity of an electron whose kinetic energy is 1 eV is about $5.9 \times 10^5$ m/s, and the velocity of a hydrogen atom whose kinetic energy is 1 eV is about $1.4 \times 10^4$ m/s. Then, in a magnetic field having a magnetic flux density of 1 kG, the Larmor radius $\rho$ of the electron whose kinetic energy is 1 eV is about 0.03 mm, and the Larmor radius $\rho$ of the hydrogen atom whose kinetic energy is 1 eV is about 1.5 mm. Here, if the aperture radius in the center of the second-stage electrode 304 is about 5 mm, for example, since the Larmor radius $\rho$ of the low energy electron or ion is smaller than the aperture radius, the electron or ion does not collide with the inner wall of the electrode 304, but it is trapped by the magnetic field so as to gyrate in the center space. Consequently, the low energy electrons or negative ions (anions) are confined in the center space of the second-stage electrode 304. Therefore, a negative space potential is formed in the center space of the electrode 304. Since this negative space potential affects the trajectory of an incident electron for writing, the irradiation position on the surface of the target object 101 deviates. Then, according to the first embodiment, this negative space potential is eliminated.

Figure 6:
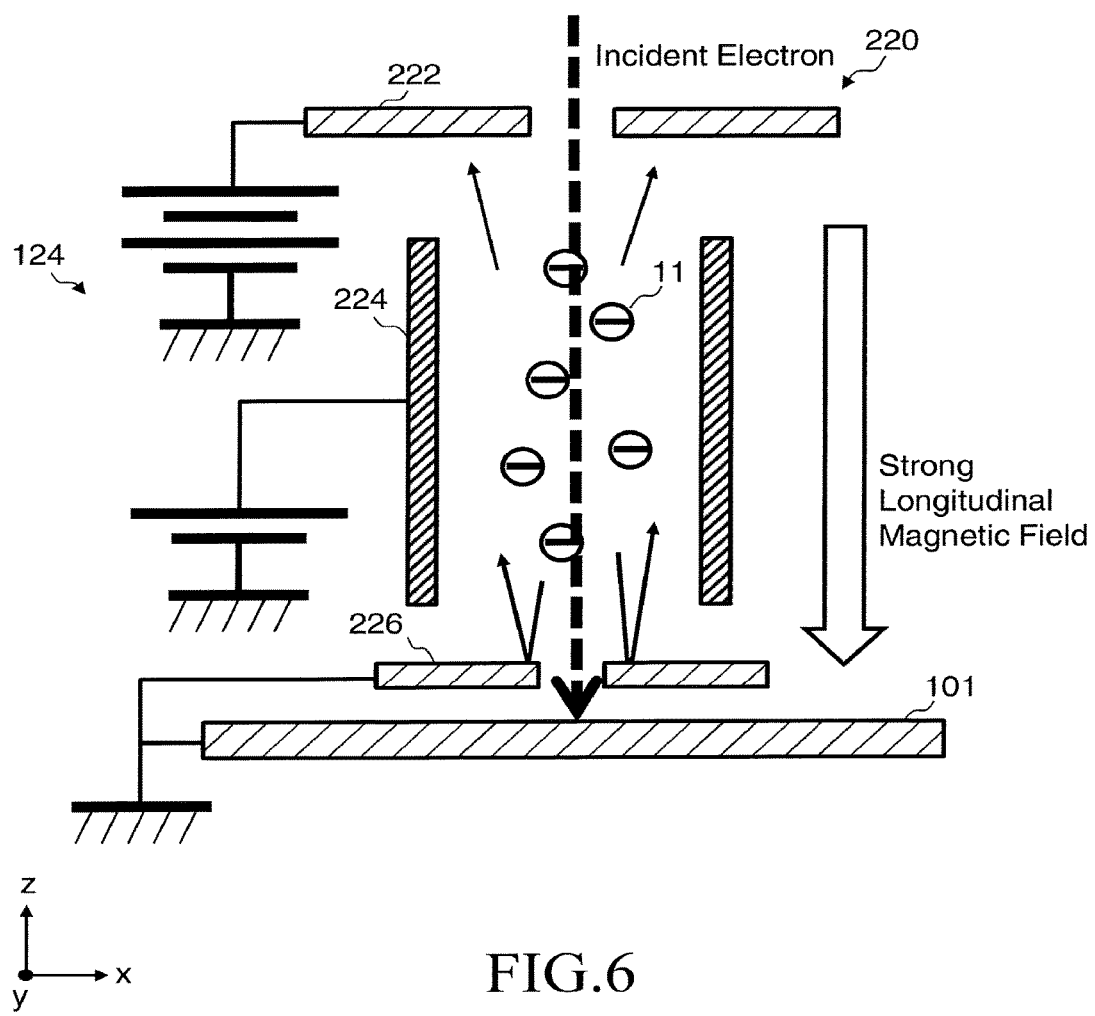
FIG. 6 shows an example of the state in the magnetic field of an objective lens according to the first embodiment.

FIG. 6 shows an example of the state in the magnetic field of an objective lens according to the first embodiment. In the first embodiment, the electrostatic lens 220 is arranged in the magnetic field of the objective lens 207 (not shown), where, as described above, the electrostatic lens 220 is composed of the first-stage electrode 222, the second-stage electrode 224, and the third-stage electrode 226. In the first embodiment, a positive potential (first potential) is variably applied to the second-stage electrode 224. On the other hand, a positive potential (second potential) higher than that (first potential) applied to the second-stage electrode 224 is applied to the first-stage electrode 222. A ground potential (third potential) is applied to the surface of the target object 101, and the third-stage electrode 226. When the positive potential applied to the second-stage electrode 224 is variably controlled within the range of, for example, from 0 to +100 V, a potential higher than this range, such as +150 V, is applied to the first-stage electrode 222. In other words, the electric potential of the second-stage electrode 224 is variably controlled within the range lower than the electric potential of the first-stage electrode 222. Focus adjustment can be performed rapidly and dynamically by variably applying a positive potential to the second-stage electrode 224 in the state where potentials of the first-stage electrode 222 and the third-stage electrode 226 have been fixed.

In FIG. 6, similarly to FIG. 4, the incident electron having passed through the aperture of the first-stage electrode 222 collides with the third-stage electrode 226 or the surface of the target object 101, thereby generating low energy secondary electrons. Moreover, a neutral gas existing in the central part of the electrostatic lens 220 is ionized, thereby also generating low energy electrons or ions (positive, negative). However, according to the first embodiment, since a positive electric potential higher than that applied to the second-stage electrode 224 has been applied to the first-stage electrode 222, low energy component electrons or negative ions, having negative charges, are attracted by the first-stage electrode 222 located upper and absorbed thereby. Consequently, it is possible not to form a negative space potential in the center space of the electrode 304 or possible to reduce the negative space potential. With respect to a low energy positive ion (cation), since its amount is small and is not easily supplemented by the electric field, its influence can be neglected.

Therefore, in an electron beam dynamic focus adjustment method according to the first embodiment, a dynamic focusing step is performed as follows: In the state where the electron beam 200 has been focused on the surface of the target object 101 by the objective lens 207, the focus of the electron beam 200 is dynamically adjusted depending on unevenness (concave and convex) of the surface of the target object 101, using an annular multi-stage electrode composed of the first-stage, second-stage, and third-stage electrodes, by variably changing a positive potential applied to the second-stage electrode 224, and making potentials applied to the first-stage electrode 222 and the third-stage electrode 226 fixed.

Then, in a low energy component removal step, by making a potential applied to the first-stage electrode 222 be a positive potential higher than that applied to the second-stage electrode 224, electrons and negative ions of a low energy component 11, having negative charges, which float at the side of the optical axis of the second-stage electrode 224 are removed to the side of the first-stage electrode 222.

As described above, according to the first embodiment, dynamic focus adjustment can be performed while preventing a negative space potential which affects the trajectory of the electron beam 200 from being generated. Consequently, writing can be performed with great precision.

Second Embodiment

Figure 7:
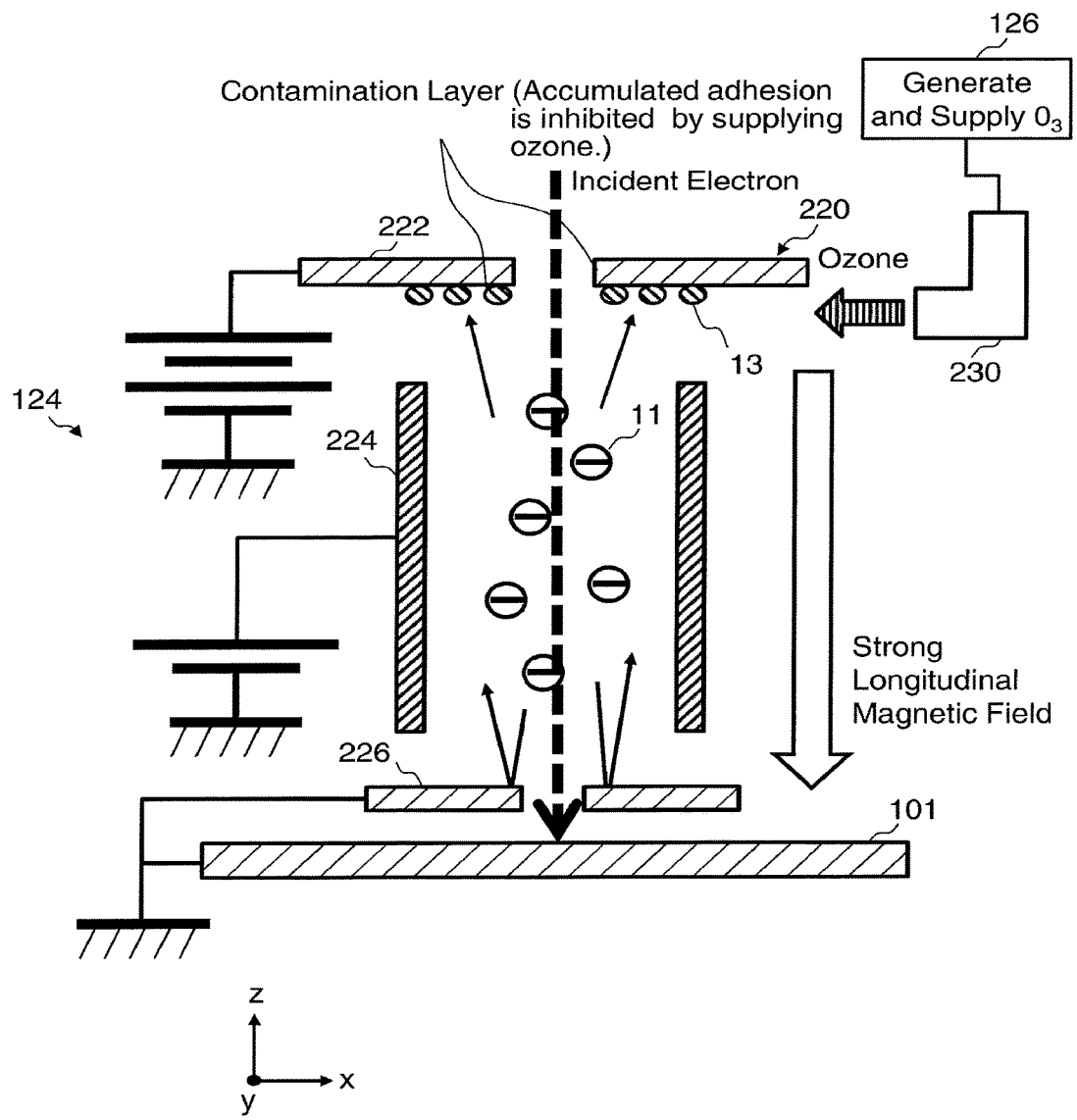
FIG. 7 shows an example of the state in the magnetic field of an objective lens according to the second embodiment.

FIG. 7 shows an example of the state in the magnetic field of an objective lens according to the second embodiment. In the second embodiment, as shown in FIG. 7, in addition to the structure of the first embodiment, an ozone ($O_3$) supply device 126 and an ozone ($O_3$) supply port 230 are further arranged. Other structure of the writing apparatus 100 in the second embodiment is the same as that of FIG. 1. The contents of the present embodiment are the same as those of the first embodiment except for what is specifically described below.

The ozone ($O_3$) supply device 126 is controlled by the control computer 110. The $O_3$ supply port 230 (supply unit) which supplies ozone is arranged on the back side of the first-stage electrode 222 (second electrode) in the electrostatic lens 220 as shown in FIG. 7. As described above, low energy component electrons or negative ions which float at the side of the optical axis of the second-stage electrode 224 are attracted to the side of the first-stage electrode 222. Then, the electrons and negative ions of the low energy component 11, having negative charges, are made to collide with the back side of the first-stage electrode 222. Due to this collision, impurities (contamination) 13 adhere to the electrode 222. Then, according to the second embodiment, an ozone gas is supplied to the back side of the electrode 222. The adhering contamination 13 is washed by the ozone gas, and besides the adhesion itself of the contamination 13 can be inhibited by this ozone gas.

Third Embodiment

Figure 8:
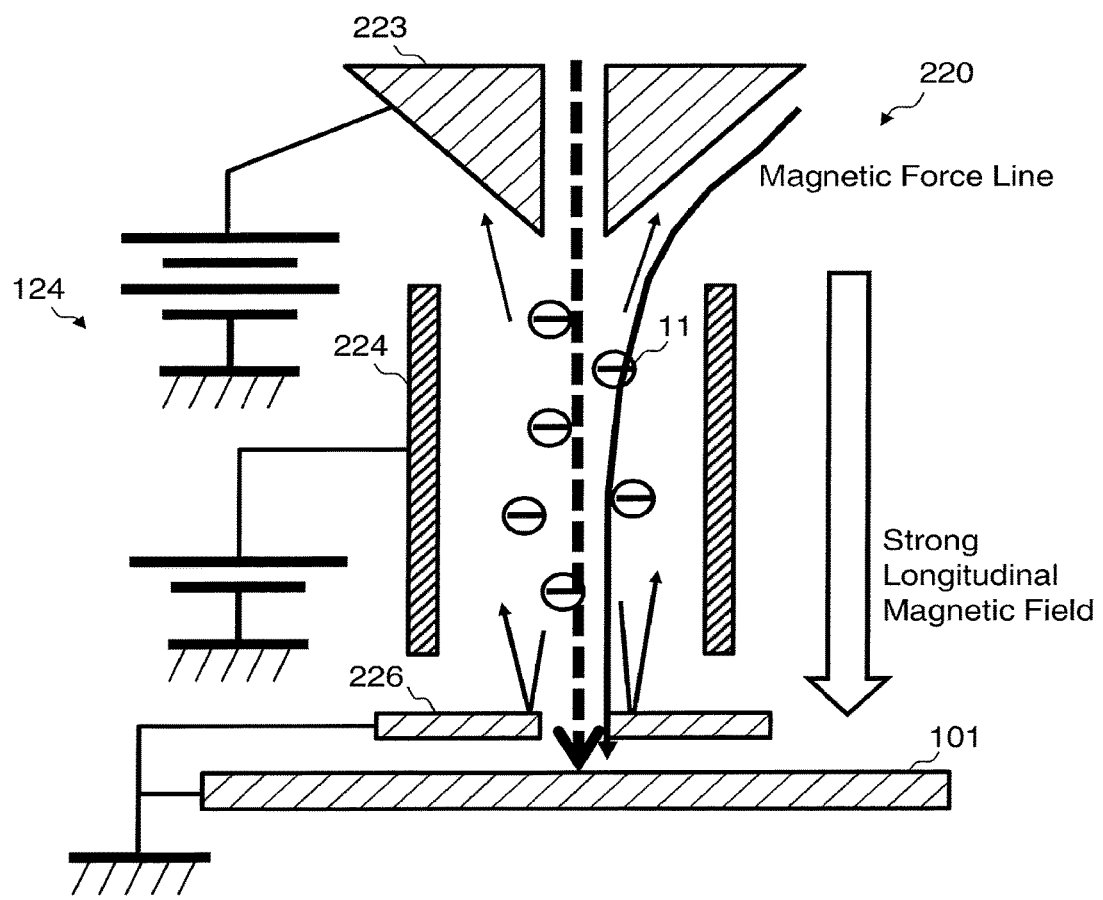
FIG. 8 shows an example of the state in the magnetic field of an objective lens according to the third embodiment.

FIG. 8 shows an example of the state in the magnetic field of an objective lens according to the third embodiment. In the third embodiment, as shown in FIG. 8, instead of the first-stage electrode 222 in the electrostatic lens 220, a conical first-stage electrode 223 is arranged, whose peripheral shape tapers in the downstream direction along the optical axis (the second-stage electrode 224 side). Other structure of the writing apparatus 100 in the third embodiment is the same as that of FIG. 1. The contents of the present embodiment are the same as those of the first embodiment except for what is specifically described below.

According to the third embodiment, the magnetic flux density on the central axis at the position of the electrode 223 is made to be smaller than that on the central axis at the position of the first-stage electrode 222, and the peripheral shape of the first-stage electrode 223 is made to be along the shape of magnetic force line which becomes denser toward the surface of the target object. With such a shape, the collision position of electrons or negative ions of the low energy component 11 having negative charges, which collides with the first-stage electrode 223, can be far from the second-stage electrode 224. Therefore, even when an electric field is formed by the adhering contamination, influence of the electric field can be reduced.

Fourth Embodiment

Figure 9:
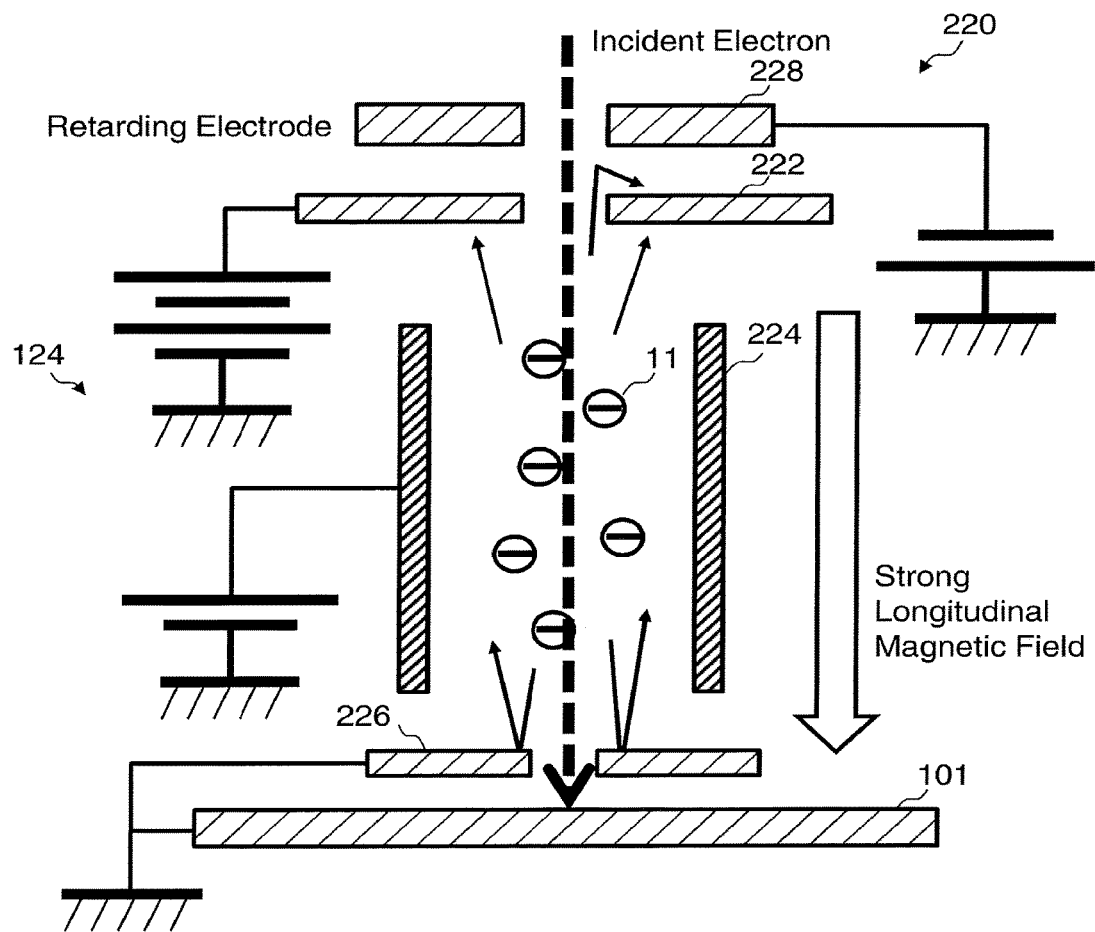
FIG. 9 shows an example of the state in the magnetic field of an objective lens according to the fourth embodiment.

FIG. 9 shows an example of the state in the magnetic field of an objective lens according to the fourth embodiment. In the fourth embodiment, as shown in FIG. 9, an annular retarding electrode 228 (fourth electrode) is further arranged upper the first-stage electrode 222 in the electrostatic lens 220. Specifically, the retarding electrode 228 (fourth electrode) is arranged between the deflector 208 and the first-stage electrode 222 (second electrode). A negative potential is applied to the retarding electrode 228. Other structure of the writing apparatus 100 in the fourth embodiment is the same as that of FIG. 1. The contents of the present embodiment are the same as those of the first embodiment except for what is specifically described below. The position and potential of the retarding electrode 228 are determined based on simulation or experiment performed in a manner such that negative space potential formation in the space in the central portion of the electrostatic lens is inhibited and position accuracy of an electron beam irradiating the surface of the target object 101 is maintained by preventing almost all the electrons, whose trajectories have been inverted, from returning to or "staying in" the inside the electrode 224 and by making them reach the electrode 222.

With respect to the electrons or negative ions of the low energy component 11, with negative charges, having passed through the aperture at the center of electrode 222 because of being attracted by the first-stage electrode 222, it is possible, by using the structure described above, to make their directions invert by the negative potential of the retarding electrode 228, and to make them collide with the upper surface of the electrode 222. Thereby, it is possible to avoid or reduce that the low energy electrons or negative ions collide with the deflector 208 arranged above the electrostatic lens 220. Consequently, adhesion of contamination to the deflector 208 can be avoided or reduced. Therefore, deflection deviation resulting from the electric field by the adhering contamination can be avoided or reduced.

Fifth Embodiment

Figure 10:
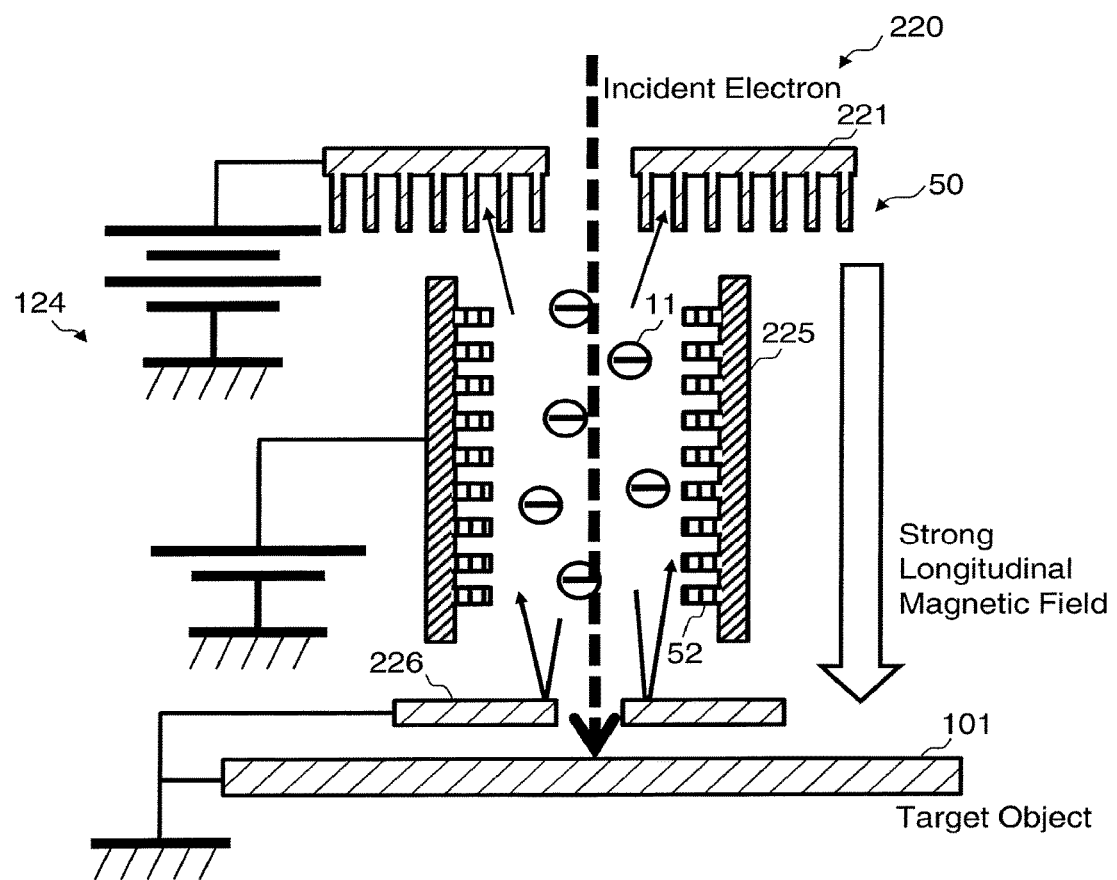
FIG. 10 shows an example of the state in the magnetic field of an objective lens according to the fifth embodiment.
Figure 11:
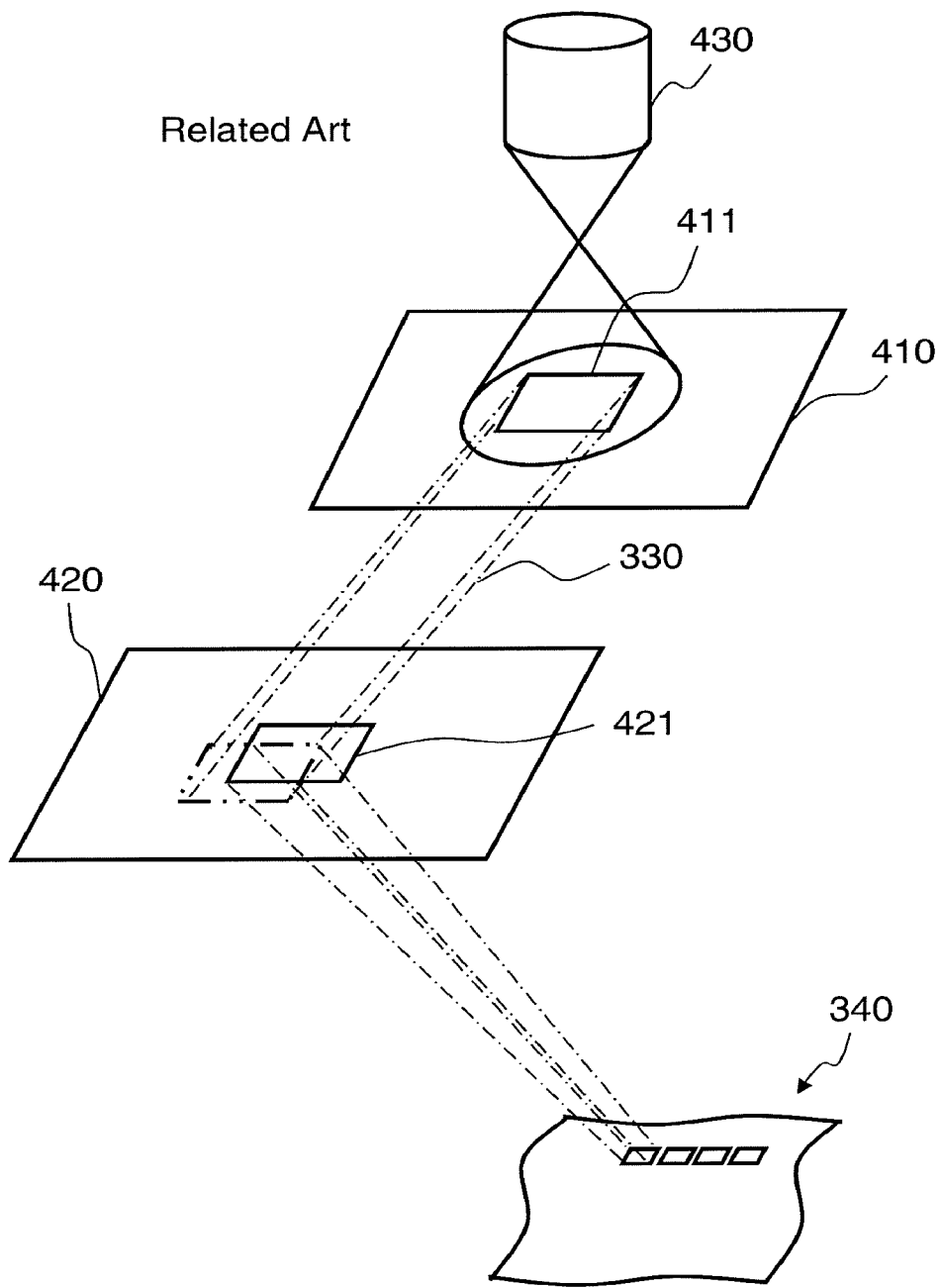
FIG. 11 is a conceptual diagram explaining operations of a variable-shaped electron beam writing apparatus.

FIG. 10 shows an example of the state in the magnetic field of an objective lens according to the fifth embodiment. In the fifth embodiment, as shown in FIG. 10, the back side of the first-stage electrode 221 is formed as a honeycomb structure 50 where tubular hexagonal prisms, whose inner and outer peripheries are hexagonal, are tightly arranged, for example. Alternatively, the back side of the first-stage electrode 221 is formed as a corrugated structure with unevenness. Similarly, the inner wall of the second-stage electrode 225 is formed as a honeycomb structure 52 where tubular hexagonal prisms, whose inner and outer peripheries are hexagonal, are tightly arranged, for example. Alternatively, the inner wall of the second-stage electrode 225 is formed as a corrugated structure with unevenness. Other structure of the writing apparatus 100 in the fifth embodiment is the same as that of FIG. 1. The contents of the present embodiment are the same as those of the first embodiment except for what is specifically described below.

With this structure, when the electrons or negative ions of the low energy component 11, with negative charges, collide with the back side of the electrode 221, trapping (capturing) can be performed without making them invert. Similarly, when the electrons or negative ions of the low energy component 11, with negative charges, collide with the inner wall of the electrode 225, trapping (capturing) can be performed without making them invert.

Embodiments have been explained referring to specific examples described above. However, the present invention is not limited to these specific examples.

For each electrode configuring the electrostatic lens 220, conductive material such as metal is used. Alternatively, it is also preferable to configure the first-stage electrode 222 and/or the second-stage electrode 224 by carbon (C) material. Generation of a secondary electron can be inhibited by using carbon (C) material.

While the apparatus configuration, control method, and the like not directly necessary for explaining the present invention are not described, some or all of them can be selectively used case-by-case basis. For example, although description of the configuration of the control circuit for controlling the writing apparatus 100 is omitted, it should be understood that some or all of the configuration of the control circuit can be selected and used appropriately when necessary.

In addition, any other electron beam irradiation apparatus and electron beam dynamic focus adjustment method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electron beam irradiation apparatus comprising:
an emission source configured to emit an electron beam;
a deflector configured to deflect the electron beam to a desired position on a surface of a target object;
an objective lens configured to focus the electron beam to form an image on the surface of the target object;
a first electrode being annular, arranged along an optical axis of the electron beam, at a position downstream from the deflector, and in a magnetic field of the objective lens, in which a first aperture is formed in a central portion such that the electron beam passes through it, and to which a first potential being positive is variably applied;
a second electrode being annular, arranged in the magnetic field of the objective lens and between the deflector and the first electrode, in which a second aperture is formed in a central portion such that the electron beam passes through it, and to which a second potential being positive and higher than the first potential is applied; and
a third electrode being annular, arranged in the magnetic field of the objective lens and at a position opposite to the second electrode with respect to the first electrode, in which a third aperture is formed in a central portion such that the electron beam passes through it, and to which a third potential lower than the first potential is applied.

2. The apparatus according to claim 1, further comprising:
a fourth electrode being annular, arranged between the deflector and the second electrode, to which a negative potential is applied.

3. The apparatus according to claim 2, wherein the second electrode is formed such that its peripheral shape tapers toward the first electrode.

4. The apparatus according to claim 1, wherein the second electrode is arranged in the magnetic field of the objective lens and at a position where a magnetic flux density on a central axis of the magnetic field is lower than that of the first electrode.

5. The apparatus according to claim 1, further comprising:
a supply port configured to supply ozone to a back side of the second electrode.

6. The apparatus according to claim 1, wherein potential of the first electrode is variably controlled in a range lower than potential of the second electrode.

7. The apparatus according to claim 1, wherein the second electrode is formed such that its portion at a side of the first electrode is a honeycomb structure.

8. The apparatus according to claim 1, wherein the second electrode is formed such that its portion at a side of the first electrode is a corrugated structure.

9. The apparatus according to claim 1, wherein the first electrode and the second electrode are formed using carbon material.

10. An electron beam dynamic focus adjustment method comprising:
adjusting a focus of an electron beam dynamically depending on unevenness of a surface of a target object in a state where the electron beam has been focused on the surface of the target object by an objective lens, using an annular multi-stage electrode composed of a first-stage electrode, a second-stage electrode, and a third-stage electrode, by variably changing a first potential being positive applied to the second-stage electrode, and making a second potential applied to the first-stage electrode and a third potential applied to the third-stage electrode fixed; and
making the second potential applied to the first-stage electrode be a positive potential higher than the first potential, and removing an electron of a low energy component which floats at a side of an optical axis of the second-stage electrode to a side of the first-stage electrode.

* * * * *